(12) United States Patent
Nunokawa

(10) Patent No.: US 7,550,831 B2
(45) Date of Patent: Jun. 23, 2009

(54) ELECTRONIC DEVICE AND SEMICONDUCTOR DEVICE

(75) Inventor: Mitsuji Nunokawa, Yamanashi (JP)

(73) Assignee: Eudyna Devices Inc., Yamanashi (JP)

( * ) Notice: Subject to any disclaimer, the term of this patent is extended or adjusted under 35 U.S.C. 154(b) by 315 days.

(21) Appl. No.: 11/637,878

(22) Filed: Dec. 13, 2006

(65) Prior Publication Data
US 2007/0138622 A1    Jun. 21, 2007

(30) Foreign Application Priority Data
Dec. 16, 2005    (JP)    ............... 2005-362649

(51) Int. Cl.
*H01L 23/02* (2006.01)
(52) U.S. Cl. .................. 257/680; 257/704; 257/433; 257/434; 257/E21.001
(58) Field of Classification Search .................. 257/680, 257/704, 433, 434, E21.001
See application file for complete search history.

(56) References Cited

U.S. PATENT DOCUMENTS 5,991,989 A * 11/1999 Onishi et al. ............... 29/25.35
7,368,816 B2 * 5/2008 Lim et al. ............... 257/710
2006/0113660 A1 * 6/2006 Liao et al. ............... 257/704

FOREIGN PATENT DOCUMENTS

JP    9-102705 A    4/1997
JP    2005-217222 A    8/2005

* cited by examiner

*Primary Examiner*—Phat X Cao
(74) *Attorney, Agent, or Firm*—Westerman, Hattori, Daniels & Adrian, LLP.

(57) ABSTRACT

An electronic device has a substrate, a conductive layer and a substrate mounted portion. The substrate has a circuit portion used from 60 GHz to 80 GHz. The conductive layer is provided directly on a face of the substrate that is opposite side of the circuit portion. The face having the circuit portion of the substrate is mounted face down on the substrate mounted portion. A thickness of the conductive layer is a thickness where a sheet resistance of the conductive layer is ¼ to 4 times of a resistance component of an impedance of the substrate.

10 Claims, 11 Drawing Sheets

US 7,550,831 B2

ELECTRONIC DEVICE AND SEMICONDUCTOR DEVICE

BACKGROUND OF THE INVENTION

1. Field of the Invention

This invention generally relates to an electronic device and a semiconductor device, and in particular, relates to an electronic device and a semiconductor device using a high frequency wave.

2. Description of the Related Art

Recently, radio wave such as a microwave or a milliwave (high frequency wave) is used in a communication field including a cellular phone. The high frequency wave is used for a radar or the like measuring a distance between two cars. A high-frequency-wave semiconductor device is often downsized, and is often mounted face down in order to restrain a loss of a signal. The high-frequency-wave semiconductor device is used for an electronic device using a high frequency wave.

The face-down mounting is a method of mounting a face, where a circuit portion using a high frequency wave is provided, on a wiring pattern of a package acting as a substrate mounted portion. Hereinafter, the face, where the circuit portion using the high frequency wave is provided, is referred to a front face and, a face backside of the front face is referred to a back face. The circuit portion is a circuit where an active device or a passive device are provided, the active device including such as a transistor or a diode, the passive device including such as a capacitor, a diode, or a wiring pattern. Or the circuit portion is a portion where a stand-alone device is provided.

In a high-frequency-wave semiconductor device, there are problems caused by a high frequency wave generated in the circuit portion. Japanese Patent Application Publication No. 9-102705 discloses an art (hereinafter referred to a conventional embodiment 1) where a dielectric substrate is provided in order to absorb an unnecessary electrical wave generated from a microwave integrated circuit mounted in a chassis, the dielectric substrate having a resistive layer on a face thereof facing to the microwave integrated circuit. Japanese Patent Application Publication No. 2005-217222 discloses an art (hereinafter referred to a conventional embodiment 2) where a shield layer is provided on a back face of an analog element mounted face down in order to limit a noise fed into the analog element, the shield layer being composed of a soft magnetic material.

In an electronic device having a high-frequency-wave semiconductor device, a high frequency wave generated in the circuit portion is reflected in a package and fed into the circuit portion as a reflection wave. In particular, a high frequency wave in a range 60 GHz to 80 GHz goes straight. And a reflection wave reflected in the package interferes a signal in the circuit portion. The high frequency wave from a circuit portion, which is provided on a substrate mounted face down, is reflected at a back face of the substrate. Thus, in a structure of the conventional embodiment 1, it is not possible to restrain that the high frequency wave emitted from the circuit portion is reflected at an interface between the substrate and the air and goes to the circuit portion. In a structure of the conventional embodiment 2, the high frequency wave is reflected at an interface between the substrate and the soft magnetic material. Thus, it is not sufficiently restrained that the high frequency wave emitted from the circuit portion is reflected and goes to the circuit portion. In addition, it is necessary to form a soft magnetic material of a few hundreds μm on a back face of the substrate. And the manufacturing cost increases.

SUMMARY OF THE INVENTION

The present invention provides a semiconductor device mounted face down and an electronic device including the semiconductor device that are capable of limiting a reflection of a high frequency wave generated in a circuit portion at a back face of a substrate.

According to an aspect of the present invention, preferably, there is provided an electronic device including a substrate, a conductive layer and a substrate mounted portion. The substrate has a circuit portion used from 60 GHz to 80 GHz. The conductive layer is provided directly on a face of the substrate that is opposite side of the circuit portion. The face having the circuit portion of the substrate is mounted face down on the substrate mounted portion. The substrate is one of a GaAs substrate, a Si substrate, a SiC substrate, a sapphire substrate and a GaN substrate. The conductive layer is one of a NiCr layer of 4 nm to 70 nm thickness, a TaN layer of 10 nm to 200 nm thickness, an ITO (Indium Tin Oxide) layer of 10 nm to 160 nm thickness, in a case where the substrate is the GaAs substrate. The conductive layer is one of a NiCr layer of 3 nm to 65 nm thickness, a TaN layer of 10 nm to 180 nm thickness, an ITO layer of 5 nm to 140 nm thickness, in a case where the substrate is the Si substrate. The conductive layer is one of a NiCr layer of 3 nm to 63 nm thickness, a TaN layer of 7 nm to 160 nm thickness, an ITO layer of 5 nm to 140 nm thickness, in a case where the substrate is the SiC substrate. The conductive layer is one of a NiCr layer of 3 nm to 63 nm thickness, a TaN layer of 7 nm to 160 nm thickness, an ITO layer of 5 nm to 140 nm thickness, in a case where the substrate is the sapphire substrate. The conductive layer is one of a NiCr layer of 3 nm to 68 nm thickness, a TaN layer of 10 nm to 180 nm thickness, an ITO layer of 5 nm to 140 nm thickness, in a case where the substrate is the GaN substrate.

With the above-mentioned configuration, it is possible to limit a reflection of a high frequency wave at an interface between the substrate and the conductive layer, in a high-frequency-wave electronic device mounted face down. It is possible to form the conductive layer easily, and to reduce a manufacturing cost.

According to another aspect of the present invention, preferably, there is provided an electronic device including a substrate, a conductive layer and a substrate mounted portion. The substrate has a circuit portion used from 60 GHz to 80 GHz. The conductive layer is provided directly on a face of the substrate that is opposite side of the circuit portion. The face having the circuit portion of the substrate is mounted face down on the substrate mounted portion. A thickness of the conductive layer is a thickness where a sheet resistance of the conductive layer is ¼ to 4 times of a resistance component of an impedance of the substrate.

With the above-mentioned configuration, it is possible to limit a reflection of a high frequency wave at an interface between the substrate and the conductive layer, in a high-frequency-wave electronic device mounted face down.

According to another aspect of the present invention, preferably, there is provided a semiconductor device including a substrate, a conductive layer and a face-down mounting portion. The substrate has a circuit portion used from 60 GHz to 80 GHz. The conductive layer is provided directly on a face of the substrate that is opposite side of the circuit portion. The face-down mounting portion for a face-down mounting is provided on the face having the circuit portion of the substrate. The substrate is one of a GaAs substrate, a Si substrate, a SiC substrate, a sapphire substrate and a GaN substrate. The conductive layer is one of a NiCr layer of 4 nm to 70 nm thickness, a TaN layer of 10 nm to 200 nm thickness, an ITO layer of 10 nm to 160 nm thickness, in a case where the substrate is the GaAs substrate. The conductive layer is one of a NiCr layer of 3 nm to 65 nm thickness, a TaN layer of 10 nm to 180 nm thickness, an ITO layer of 5 nm to 140 nm thickness, in a case where the substrate is the Si substrate. The conductive layer is one of a NiCr layer of 3 nm to 63 nm thickness, a TaN layer of 7 nm to 160 nm thickness, an ITO layer of 5 nm to 140 nm thickness, in a case where the substrate is the SiC substrate. The conductive layer is one of a NiCr layer of 3 nm to 63 nm thickness, a TaN layer of 7 nm to 160 nm thickness, an ITO layer of 5 nm to 140 nm thickness, in a case where the substrate is the sapphire substrate. The conductive layer is one of a NiCr layer of 3 nm to 68 nm thickness, a TaN layer of 10 nm to 180 nm thickness, an ITO layer of 5 nm to 140 nm thickness, in a case where the substrate is the GaN substrate.

With the above-mentioned configuration, it is possible to limit a reflection of a high frequency wave at an interface between the substrate and the conductive layer, in a high-frequency-wave semiconductor device to be mounted face down. It is possible to form the conductive layer easily, and to reduce a manufacturing cost.

According to another aspect of the present invention, preferably, there is provided a semiconductor device including a substrate, a conductive layer and a face-down mounting portion. The substrate has a circuit portion used from 60 GHz to 80 GHz. The conductive layer is provided directly on a face of the substrate that is opposite side of the circuit portion. The face-down mounting portion for a face-down mounting is provided on the face having the circuit portion of the substrate. A thickness of the conductive layer is a thickness where a sheet resistance of the conductive layer is ¼ to 4 times of a resistance component of an impedance of the substrate.

With the above-mentioned configuration, it is possible to limit a reflection of a high frequency wave at an interface between the substrate and the conductive layer, in a high-frequency-wave semiconductor device to be mounted face down.

BRIEF DESCRIPTION OF THE DRAWINGS

Preferred embodiments of the present invention will be described in detail with reference to the following drawings, wherein.

DESCRIPTION OF THE PREFERRED EMBODIMENTS

A description will now be given, with reference to the accompanying drawings, of embodiments of the present invention.

Figure 1:
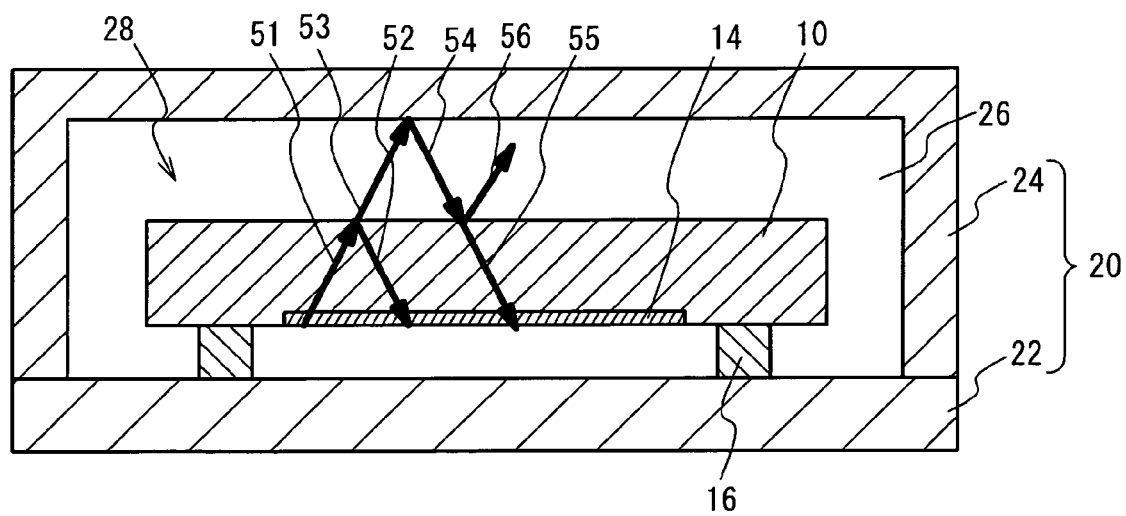
FIG. 1 illustrates a schematic cross sectional view accounting a problem of a high-frequency-wave semiconductor device mounted face down.

FIG. 1 illustrates a schematic cross sectional view accounting a problem of an electronic device that includes a high-frequency-wave semiconductor device 28 mounted face down. In the semiconductor device 28, a circuit portion 14 is provided on a substrate 10 such as a GaAs substrate. A metal bump 16 is provided on a face on which the circuit portion 14 is provided, the metal bump 16 being a face-down mounting portion electrically coupled to the circuit portion 14. The semiconductor device 28 is mounted in a package 20 as a substrate mounted portion. The package 20 includes a package substrate 22 having a wiring pattern and a chassis 24 covered with metal. The metal bump 16 provided on the substrate 10 is coupled to a wiring pattern (not shown) of the package substrate 22. A face of the substrate 10, on which the circuit portion 14 is provided, is mounted face down on the package substrate 22. That is, the substrate 10 is mounted face down in the package 20. The substrate 10 and the package 20 are coupled to each other through the metal bump 16. That is, the substrate 10 is mounted flip-chip in the package 20. The package 20 has a terminal (not shown) outside thereof. The wiring pattern is electrically coupled to the terminal. Air or an inert gas 26 is filled in the package 20.

A description will be given of a reflection at a back face of the substrate 10 of the electronic device shown in FIG. 1. An impedance in a medium such as the substrate 10 is shown as following Expression 1.

$$Z = \sqrt{\frac{\mu_0}{\varepsilon_0}} \sqrt{\frac{\mu}{\varepsilon}} \quad \text{(Expression 1)}$$

Here, "Z" indicates the impedance of the medium. "$\varepsilon_0$" indicates a dielectric constant in a vacuum (air). "$\mu_0$" indicates a magnetic permeability in the vacuum. "$\varepsilon$" indicates a relative dielectric constant. "$\mu$" indicates a relative magnetic permeability.

A reflection coefficient, in a case where a high frequency wave propagates from a medium 1 to a medium 2, is shown as following Expression 2.

$$S = \frac{Z_L - Z_C}{Z_L + Z_C} \quad \text{(Expression 2)}$$

Here, "S" indicates a reflection coefficient. "$Z_C$" indicates an impedance of the medium 1. "$Z_L$" indicates an impedance of the medium 2.

The resistance component of the impedance in a vacuum is approximately 377 Ω. Air or an inert gas 26 is filled in the package 20. The impedance does not differ in cases of in a vacuum, air, an inert gas or other gas. The package 20 may be vacuum-sealed or may be filled with a gas. The impedance in the vacuum is used as the impedance in air.

A description will be given supposing that the package 20 is filled with air. The relative dielectric constant of the substrate 10 is, for example, 13.1 in a case where the substrate 10 is composed of GaAs. In this case, the resistance component of the impedance of the GaAs substrate is 104 Ω. These values are assigned to the parameters of the Expression 2. And it is resulted that approximately 50% of the high frequency wave propagating into air from the GaAs substrate is reflected at an interface between the substrate 10 and the air 26.

Thus approximately 50% of a high frequency wave 51 from the circuit portion 14 is reflected at the back face of the substrate 10. The reflected wave is referred to a high frequency wave 52. The high frequency wave 52 goes to the circuit portion 14. The rest of the high frequency wave 51 transmits the interface between the substrate 10 and the air 26. The transmission wave is referred to a high frequency wave 53. Approximately 100% of the high frequency wave 53 is reflected at the upper face of the chassis 24. The reflected wave is referred to a high frequency wave 54. A part of the high frequency wave 54 is reflected at the interface between the air 26 and the substrate 10. The reflected wave is referred to a high frequency wave 56. The rest of the high frequency wave 54 transmits the interface between the air 26 and the substrate 10, and goes to the circuit portion 14 as a high frequency wave 55. As mentioned above, the most part of the high frequency wave 51, the high frequency waves 52 and 55, goes to the circuit portion 14 as a reflected wave.

There is a method of forming a thick conductive layer 12 on the back face of the substrate 10, beside the methods in accordance with the conventional embodiments 1 and 2. The method is for degrading an effect of the reflection wave of the high frequency wave. However, there is a problem that the process of forming the conductive layer 12 to be thick causes the increase of the manufacturing cost. So, it is examined whether a thin conductive layer limits the reflection of the high frequency wave effectively.

Figure 2:
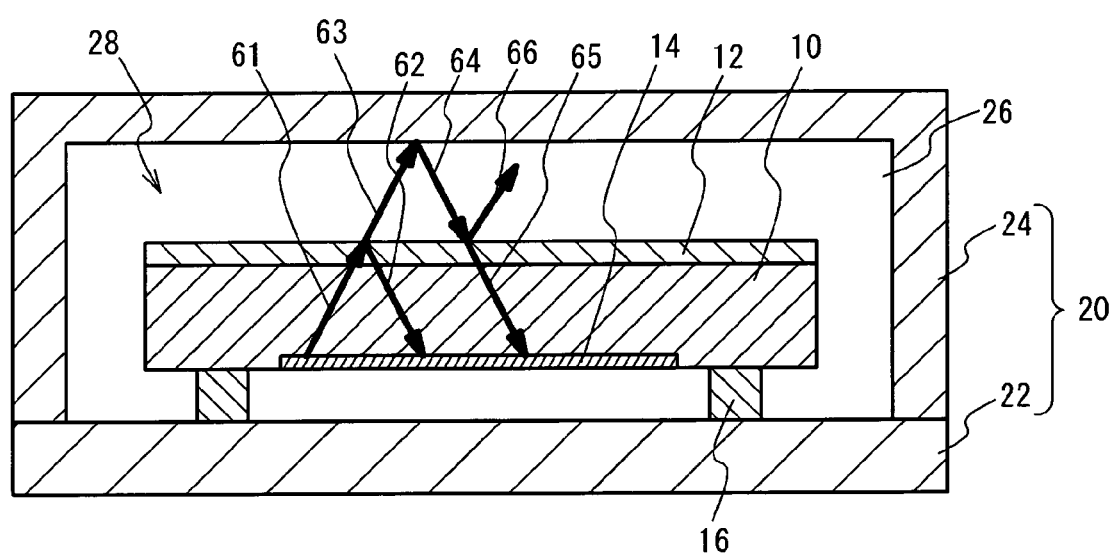
FIG. 2 illustrates a principle of the invention and a cross sectional view of FIG. 1.

FIG. 2 illustrates a cross sectional view of an electronic device for examination. The electronic device includes the high-frequency-wave semiconductor device 28. Being different from FIG. 1, the conductive layer 12 is provided at a face of the substrate 10 (a back face) that is opposite side of a face on which the circuit portion 14 is provided in the electronic device in FIG. 2. The same components have the same reference numerals in order to avoid a duplicated explanation.

It is supposed that a sheet resistance of the conductive layer 12 is an impedance. And the reflectivity of the high frequency wave from the circuit portion 14 at the interface between the substrate 10 and the conductive layer 12 is calculated with the Expression 1. When the sheet resistance of the conductive layer 12 is approximately same as the resistance component of the impedance of the substrate 10, almost all of a high frequency wave 61 from the circuit portion 14 is not reflected at the interface between the substrate 10 and the conductive layer 12 as shown in FIG. 2.

The high frequency wave 61 is attenuated as transmitting the conductive layer 12. A part of the high frequency wave 61 is reflected at the interface between the conductive layer 12 and the air 26. The reflected wave is referred to a high frequency wave 62. The high frequency wave 62 is attenuated in the conductive layer 12. The rest of the high frequency wave 61 transmits the interface between the conductive layer 12 and the air 26. The transmission wave is referred to a high frequency wave 63. The high frequency wave 63 is reflected at the chassis 24. The reflected wave is referred to a high frequency wave 64. A part of the high frequency wave 64 is reflected at the interface between the air 26 and the conductive layer 12. The reflected wave is referred to a high frequency wave 66. The rest of the high frequency wave 64 transmits the interface between the air 26 and the conductive layer 12. The transmission wave is referred to a high frequency wave 65. The high frequency wave 65 goes to the circuit portion 14. In this case, the high frequency wave 65 is attenuated in the conductive layer 12.

As mentioned above, the high frequency waves 62 and 65 transmit the conductive layer 12 twice and goes to the circuit portion 14. Therefore, the high frequency waves 62 and 65 are attenuated in the conductive layer 12. The inventor has thought that in the structure shown in FIG. 2 it is possible to restrain the affection of the reflected wave of the high frequency wave to the circuit portion 14, the high frequency wave being from the circuit portion 14. A description will be given of examples based on the principle.

FIRST EXAMPLE

The manufacturing cost increases when the thickness of the conductive layer 12 is excessive. The electrical resistivity of the conductive layer 12 is important in order to effectively limit the reflection in the thin conductive layer 12. NiCr (nickel-chrome), TaN (tantalum nitride) and ITO (indium tin oxide) having a resistivity of $1.0 \times 10^{-6}$ Ωm, $2.5 \times 10^{-6}$ Ωm and $2.0 \times 10^{-6}$ Ωm respectively were selected, as a conductive material having a resistivity of approximately $1.0 \times 10^{-6}$ Ωm. A NiCr layer, a TaN layer and an ITO layer were used as the conductive layer 12. A gallium arsenide (GaAs) substrate, a silicon (Si) substrate, a silicon carbide (SiC) substrate, a sapphire ($Al_2O_3$) substrate and a gallium nitride (GaN) substrate having a relative dielectric permeability of 13.1, 10.9, 10, 10 and 12.2 respectively were used as the substrate 10. And an amplifier was manufactured.

FIG. 3A through FIG. 3E illustrate a cross sectional view of a semiconductor device showing a manufacturing process thereof, the semiconductor device being in accordance with one of the first examples. The substrate 10 is composed of GaAs and the conductive layer 12 is composed of NiCr in the semiconductor device.

Figure 3A:
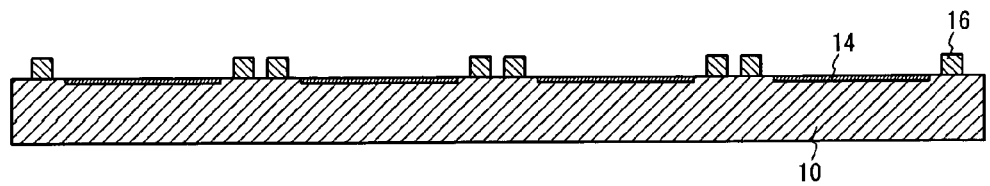
FIG. 3A through FIG. 3E illustrate a cross sectional view of a semiconductor device in accordance with a first example showing a manufacturing process thereof.
Figure 3B:
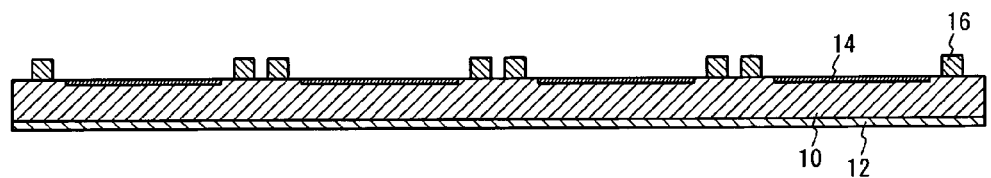

As shown in FIG. 3A, a 76 GHz amplifier as the circuit portion 14 was manufactured on the substrate 10 composed of GaAs. The metal bump 16 was formed electrically coupled to the circuit portion 14. The metal bump 16 was formed by plating with Au. As shown in FIG. 3B, the back face of the substrate 10 was grinded. And a NiCr layer as the conductive layer 12 was formed on the back face of the substrate 10 by a sputtering.

Figure 3C:
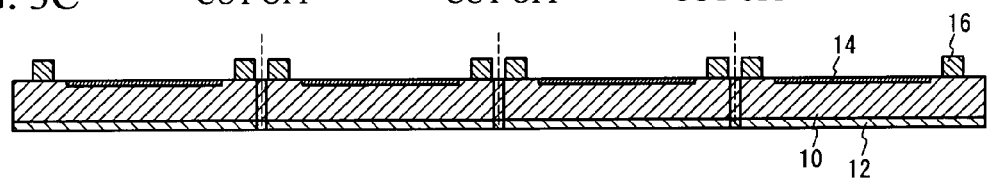

As shown in FIG. 3C, the substrate 10 and the conductive layer 12 were cut-off with a dicing into a chip as the high-frequency-wave semiconductor device 28. In the semiconductor device 28, the conductive layer 12 is electrically separated from the circuit portion 14. Thus the conductive layer 12 is electrically shut away. And it is restrained that the capacitance of the circuit portion 14 increases. The NiCr layer may be formed by an evaporation method in FIG. 3B.

Figure 3D:
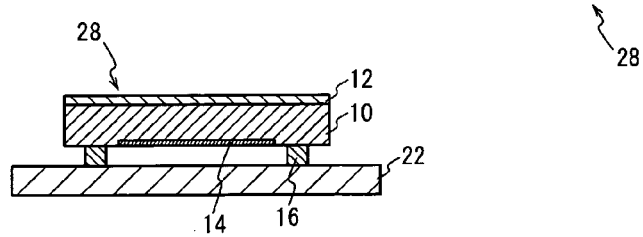
Figure 3E:
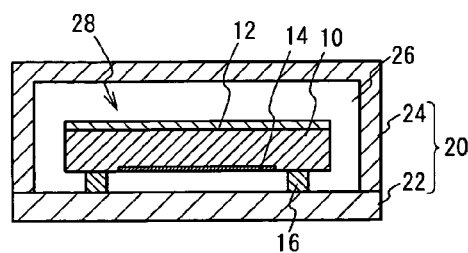

As shown in FIG. 3D, the semiconductor device 28 was mounted face down on the package substrate 22 so that the metal bump 16 was electrically coupled to the wiring pattern of the package substrate 22. As shown in FIG. 3E, the chassis 24 was bonded to the package substrate 22. The package 20 was filled with air 26. The conductive layer 12 is not coupled to the package 20. That is, the conductive layer 12 is electrically separated from the package 20. Thus the conductive layer 12 is electrically shut away. It is possible to restrain that the capacitance of the circuit portion 14 increases. The conductive layer 12 is electrically separated from the grand of the package 20. Thus it is possible to further restrain that the capacitance of the circuit portion 14 increases. With the processes, the electronic device in accordance with the first example was manufactured, the electronic device having the substrate 10 composed of GaAs and the conductive layer 12 composed of NiCr. The package 20 may be filled with the inert gas. In this case, it is possible to restrain an oxidization of the semiconductor device 28.

The electronic device having the GaAs substrate and the NiCr substrate was used and an isolation quality at 76 GHz was measured. In this case, the thickness of the NiCr layer as the conductive layer 12 was changed. The isolation quality is referred to an electrical power ratio of output signals: one of the signals is an output signal in a case where an input signal at 76 GHz is fed into the amplifier and a power supply voltage is applied to the amplifier, the other is an output signal in a case where the input signal is fed into the amplifier and the power supply voltage is not applied to the amplifier. A vector network analyzer was used for measuring the isolation quality. When the reflectivity of the high frequency wave from the circuit portion 14 is high, the reflection wave of the input signal is output as an output signal in the case where the power supply voltage is not applied to the amplifier. And the isolation quality is degraded.

Figure 4A:
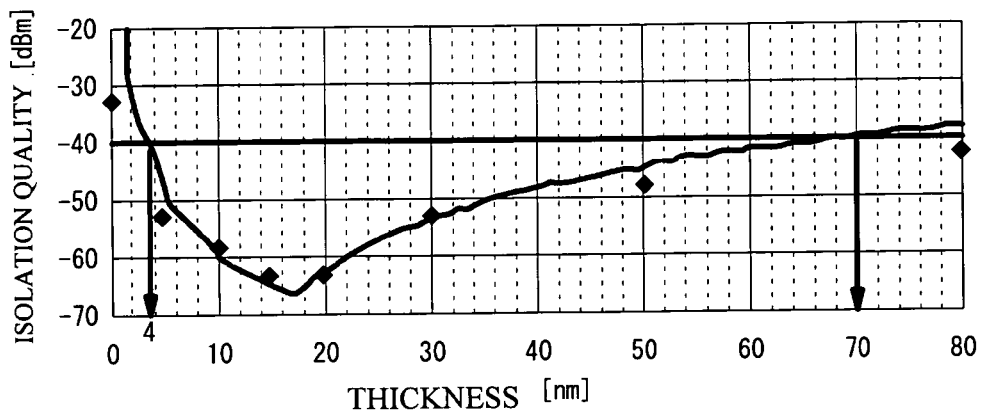
FIG. 4A through FIG. 4C illustrate an isolation quality of amplifiers when a NiCr layer is provided on a GaAs substrate, a Si substrate and a SiC substrate respectively.
Figure 4B:
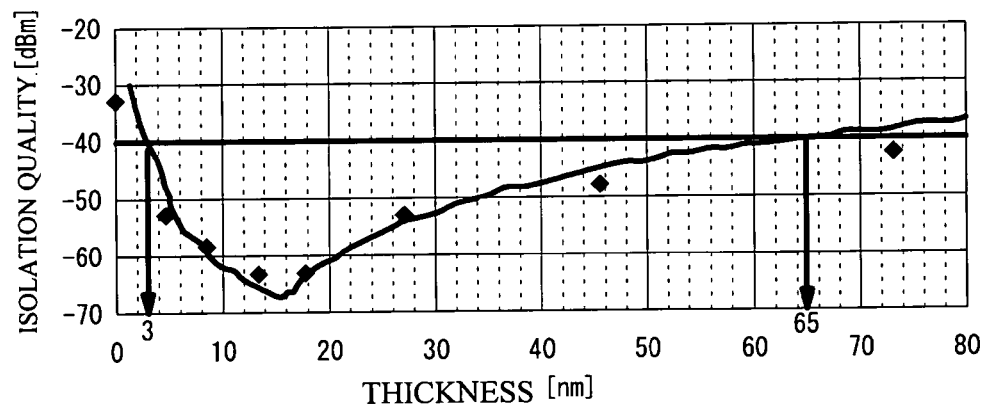
Figure 4C:
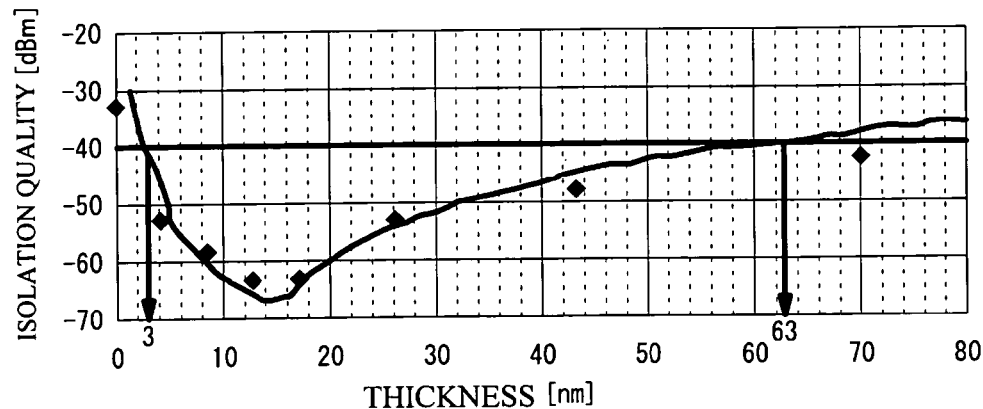

FIG. 4A illustrates the isolation quality according to the thickness of the conductive layer 12. The dots indicate a measured value. The curved line is a line where the measured values are fitted. As shown in FIG. 4A, the isolation quality of the electronic device in accordance with the first example is most favorable when the thickness of the conductive layer 12 is approximately 18 nm, and is reduced when the thickness is thinner or thicker. It is thought that the isolation quality is most favorable when the thickness of the conductive layer 12 is a value in a case where the sheet resistance of the conductive layer 12 corresponds to the resistance component of the impedance of the substrate 10. When the thickness of the conductive layer 12 gets thicker, the isolation quality is approximately constant of −40 dBm.

Accordingly, it is necessary that the thickness of the conductive layer 12 is within a range where the isolation quality is less than −40 dBm, in order to limit the reflection of the high frequency wave. Therefore, it is preferable that the thickness of the conductive layer 12 provided on the back face of the GaAs substrate is 4 nm to 70 nm in order to limit the reflection of the high frequency wave. It is preferable that the thickness of the conductive layer 12 is 6 nm to 36 nm in order to reduce the isolation quality less than −50 dBm. That is, the thickness of the conductive layer 12 is preferably ¼ to 4 times, more preferably ⅓ to 2 times, of the thickness in the case where the sheet resistance of the conductive layer 12 corresponds to the resistance component of the impedance of the substrate 10.

Figure 5:
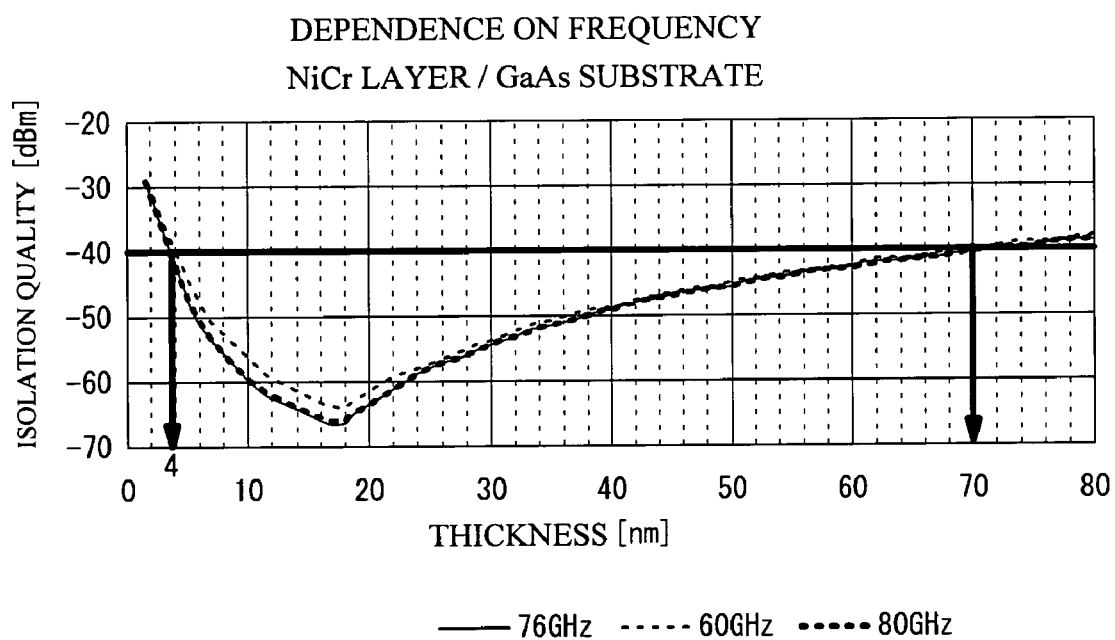
FIG. 5 illustrates an isolation quality of an amplifier at each of frequencies in a case where a NiCr layer is provided on a GaAs substrate.

FIG. 5 illustrates a measured isolation quality in a case where the input signals fed into the amplifier are of 60 GHz and 80 GHz. As shown in FIG. 5, the isolation quality approximately corresponds to that in a case of FIG. 4A, even if the frequency of the input signal is changed. There is little dependence on frequency, in the thickness of the conductive layer 12 for limiting the reflection of the high frequency wave. It is possible to limit the reflection of the high frequency wave at the interface between the substrate 10 and the conductive layer 12, in a case where the circuit portion 14 uses the high frequency waves within a range 60 GHz to 80 GHz.

Figure 6:
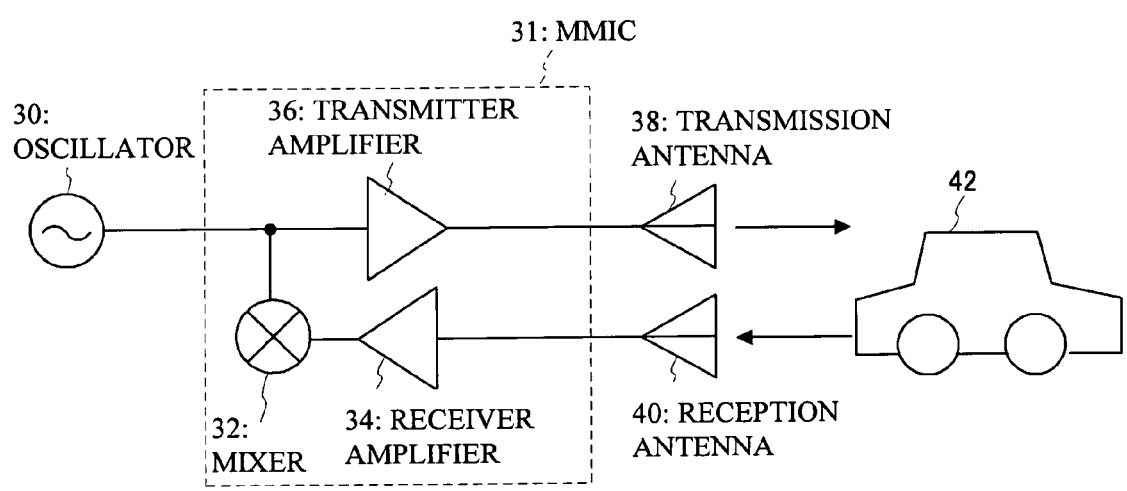
FIG. 6 illustrates a block diagram in a case where a NiCr layer is provided on a GaAs substrate.
Figure 7A:
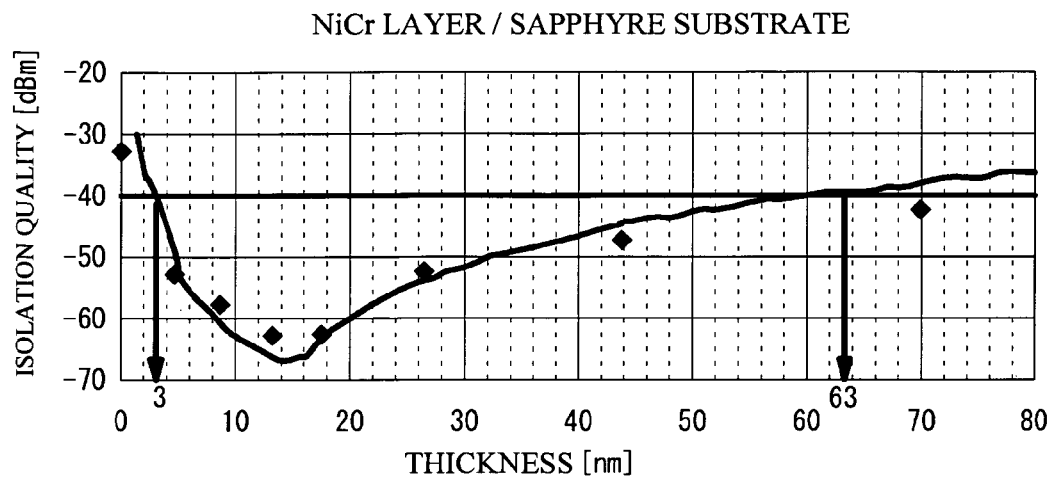
FIG. 7A and FIG. 7B illustrate an isolation quality of amplifiers when a NiCr layer is provided on a sapphire substrate and a GaN substrate respectively.
Figure 7B:
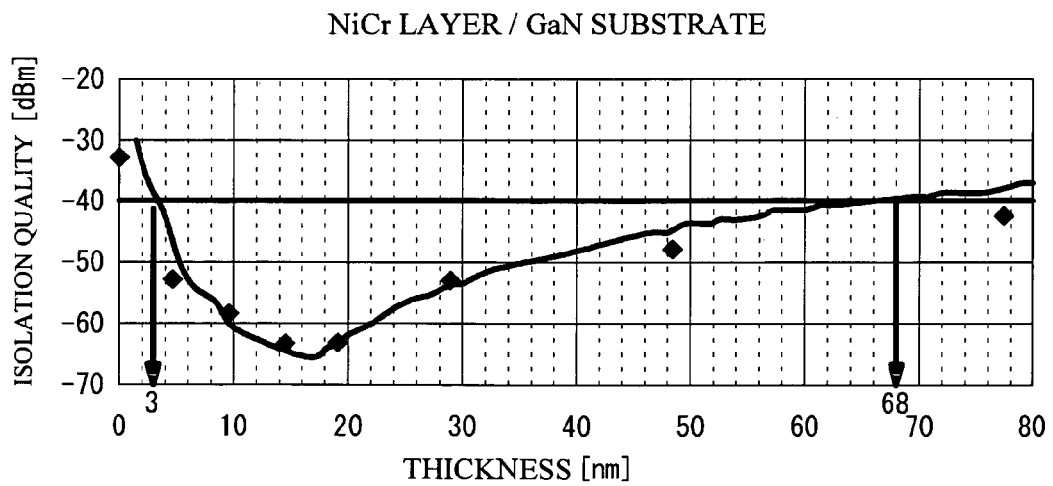
Figure 8A:
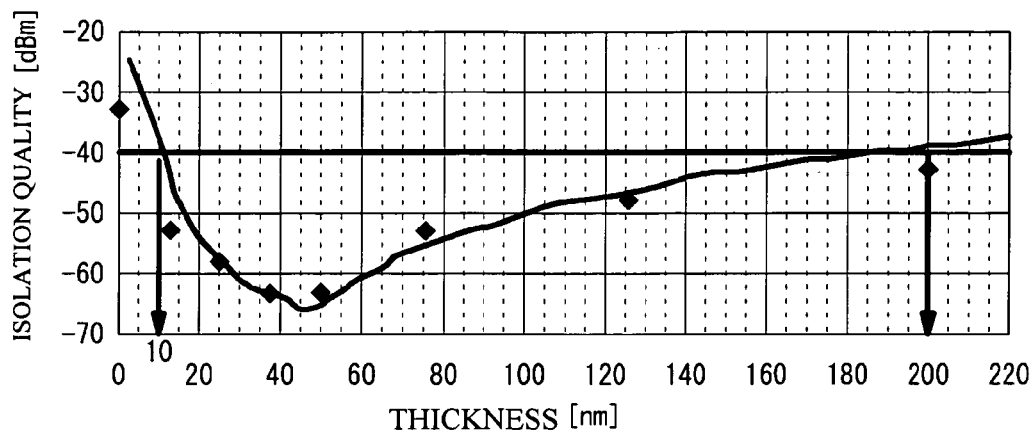
FIG. 8A through FIG. 8C illustrate an isolation quality of amplifiers in cases where a TaN layer is provided on a GaAs substrate, a Si substrate and a SiC substrate respectively.
Figure 8B:
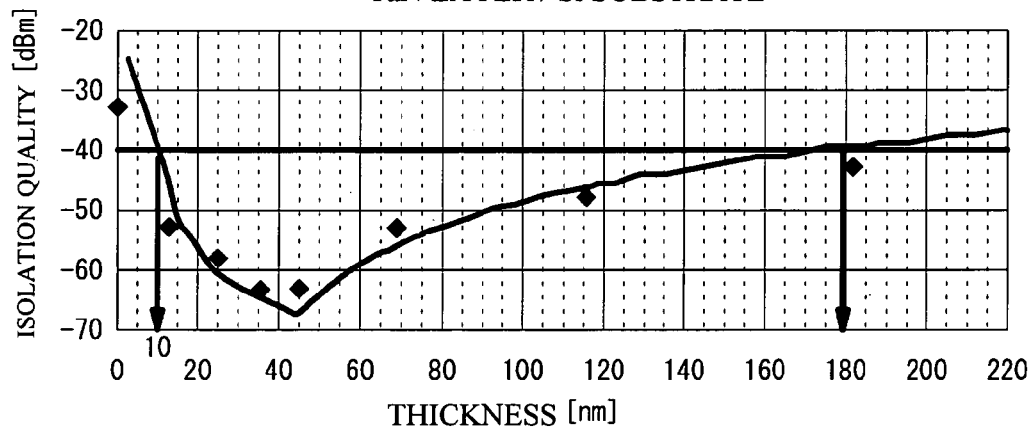
Figure 8C:
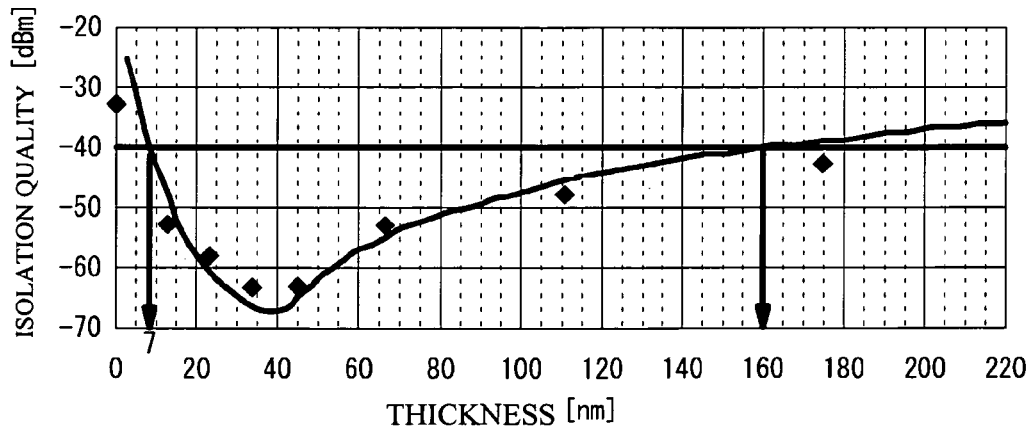
Figure 9A:
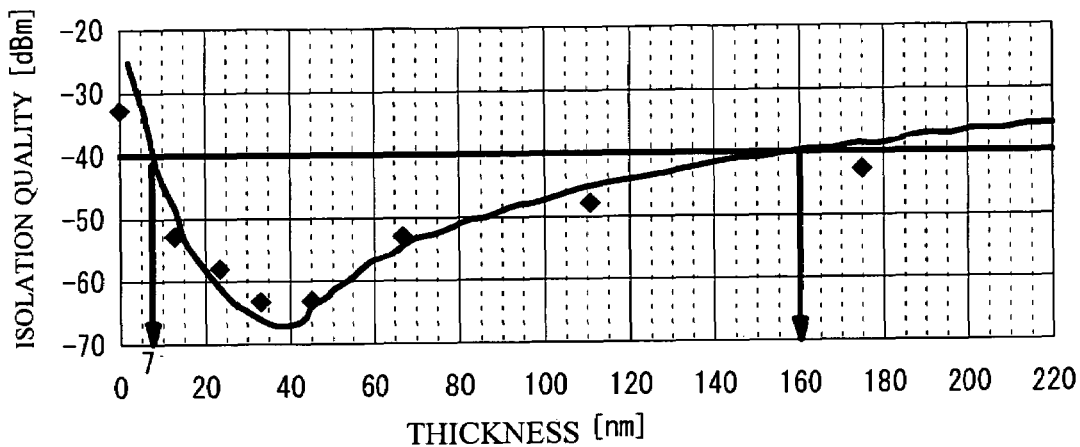
FIG. 9A and FIG. 9B illustrate an isolation quality of amplifiers in cases where a TaN layer is provided on a sapphire substrate and a GaN substrate respectively.
Figure 9B:
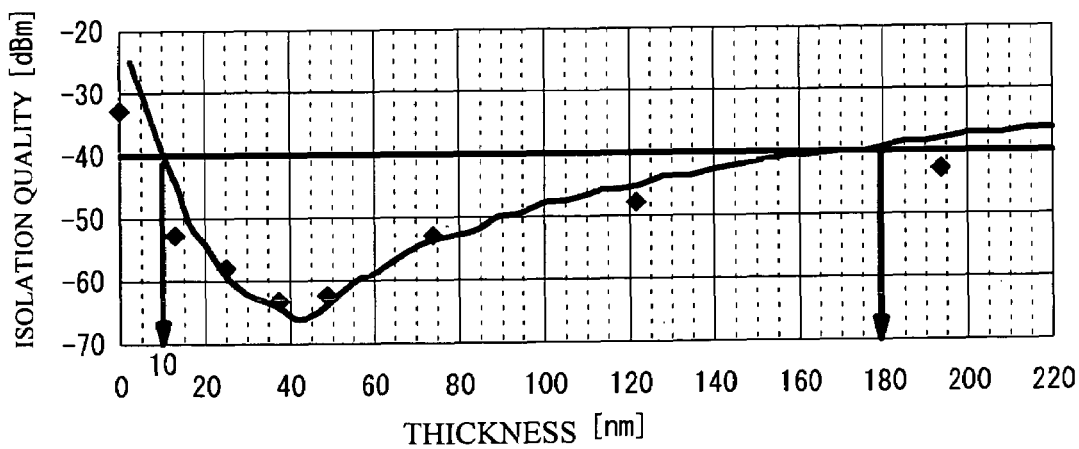
Figure 10A:
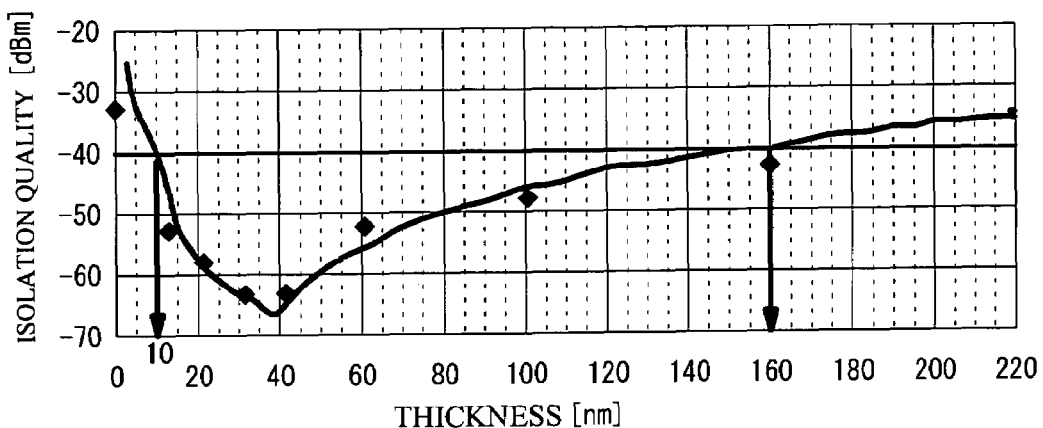
FIG. 10A through FIG. 10C illustrate an isolation quality of amplifiers in cases where an ITO layer is provided on a GaAs substrate, a Si substrate and a SiC substrate respectively.
Figure 10B:
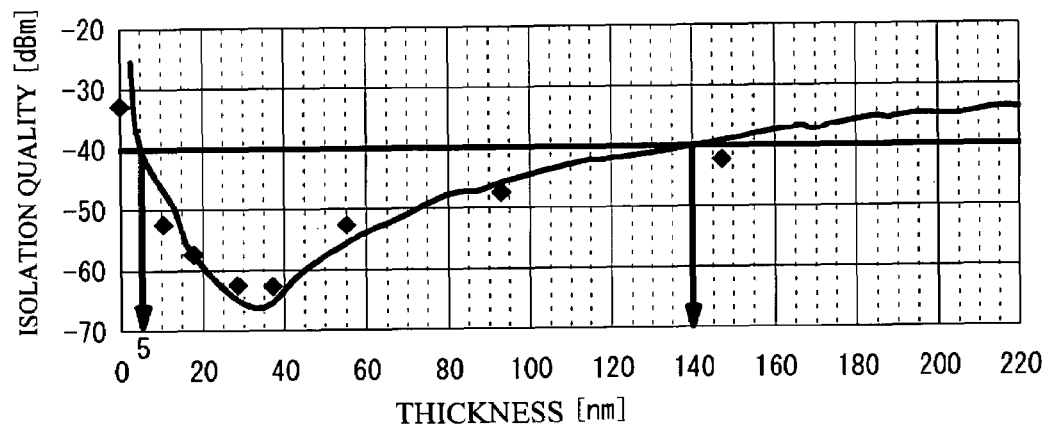
Figure 10C:
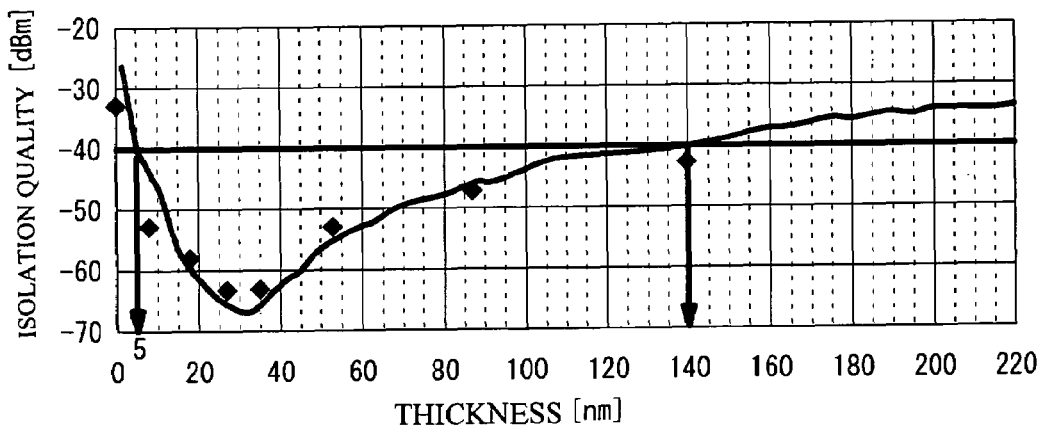
Figure 11A:
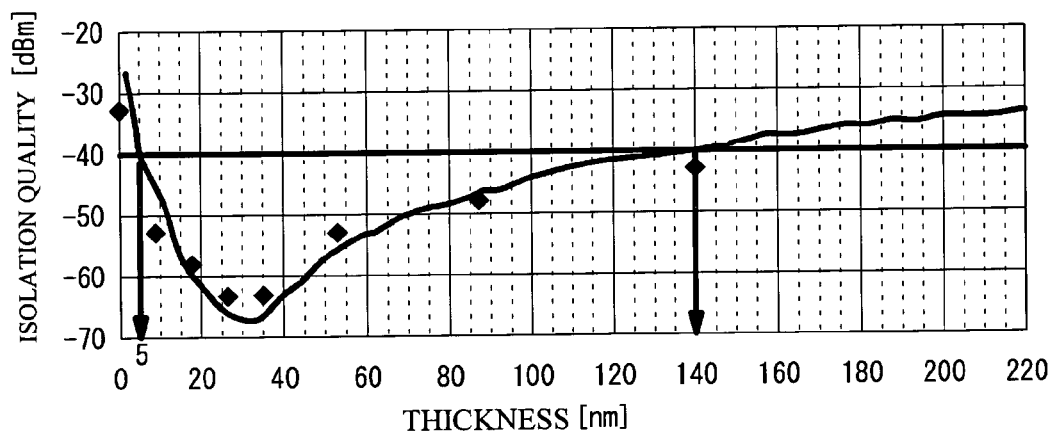
FIG. 11A and FIG. 11B illustrate an isolation quality of amplifiers in cases where an ITO layer is provided on a sapphire substrate and a GaN substrate respectively.
Figure 11B:
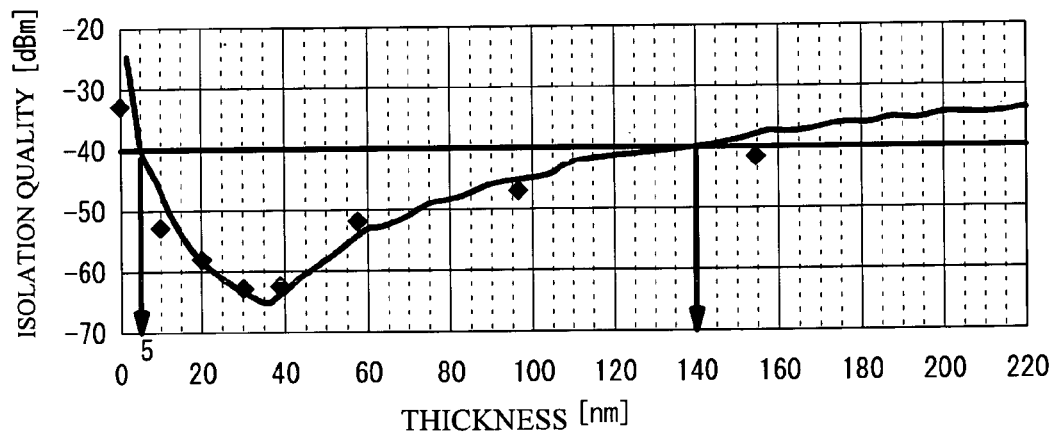

FIG. 6 illustrates a block diagram of a 76 GHz car radar including the amplifier having the GaAs substrate and the NiCr layer in accordance with the first example. A 76 GHz signal generated in an oscillator 30 is amplified in a transmitter amplifier 36, and is output from a transmission antenna 38 as a high frequency wave of 76 GHz. The high frequency wave is, for example, reflected at a car 42 and fed into a reception antenna 40. A received signal is amplified in a receiver amplifier 34 and is converted into an intermediate frequency in a mixer 32.

In the radar system mentioned above, a low-intensity high frequency wave, being pretty close to the emitted high frequency wave, is detected and amplified. Therefore, in a case where the circuit portion 14 has a circuit using a high frequency wave used for the radar system, a high frequency wave reflected at the car 42 is reflected in the package, goes to the circuit portion 14, and is indistinguishable from a high frequency wave that is emitted from the circuit portion 14. And a malfunction is possibly occurred. It is thus possible to restrain the malfunction when the embodiment is applied to the circuit. In particularly, a high frequency wave emitted from the transmitter amplifier 36 is reflected in the package and goes to the receiver amplifier 34 in a case where the transmitter amplifier 36 and the receiver amplifier 34 are provided on a GaAs substrate as an MMIC 31, that is, in a case where the circuit portion 14 has a transmission amplifier and a reception amplifier of the radar system. Therefore, the malfunction is occurred easily. However, it is possible to restrain the malfunction if the embodiment is applied.

Similarly, the isolation qualities of the amplifiers were measured, the amplifiers having a NiCr layer, a TaN layer or an ITO layer provided on a GaAs substrate, a Si substrate, a SiC substrate, a sapphire substrate or a GaN substrate. It is thought that other amplifiers not having the GaAs substrate and the NiCr layer has little dependence on frequency of an input signal in the isolation quality, as is in the case of FIG. 5. So, the isolation qualities were measured in cases where an input signal of 76 GHz is fed into the amplifier provided on the GaAs substrate and an input signal of 2 GHz is fed into the amplifiers provided on other substrates.

FIG. 4B, FIG. 4C, FIG. 7A and FIG. 7B illustrate an isolation quality when the NiCr layer is provided on the Si substrate, the SiC substrate, the sapphire substrate and the GaN substrate. As shown in the figures, the isolation qualities are less than −40 dBm when the thickness of the NiCr layer is 3 nm to 65 nm, 3 nm to 63 nm, 3 nm to 63 nm and 3 nm to 68 nm in the cases of the Si substrate, the SiC substrate, the sapphire substrate and the GaN substrate respectively.

FIG. 8A, FIG. 8B, FIG. 8C, FIG. 9A and FIG. 9B illustrate an isolation quality of the amplifiers in the cases where the TaN layer is provided on the GaAs substrate, Si substrate, the SiC substrate, the sapphire substrate and the GaN substrate respectively. As shown in the figures, the isolation qualities are less than −40 dBm when the thickness of the TaN layer is 10 nm to 200 nm, 10 nm to 180 nm, 7 nm to 160 nm, 7 nm to 160 nm and 10 nm to 180 nm in the cases of the GaAs substrate, the Si substrate, the SiC substrate, the sapphire substrate and the GaN substrate respectively.

FIG. 10A, FIG. 10B, FIG. 10C, FIG. 11A and FIG. 11B illustrate an isolation quality of the amplifiers in the cases where the ITO layer is provided on the GaAs substrate, Si substrate, the SiC substrate, the sapphire substrate and the GaN substrate respectively. As shown in the figures, the isolation qualities are less than −40 dBm when the thickness of the ITO layer is 10 nm to 160 nm, 5 nm to 140 nm, 5 nm to 140 nm, 5 nm to 140 nm and 5 nm to 140 nm in the cases of the GaAs substrate, the Si substrate, the SiC substrate, the sapphire substrate and the GaN substrate respectively.

As mentioned above, in a case where the GaAs substrate is not used for the substrate 10 and the NiCr layer is not used for the conductive layer 12, it is possible to limit the reflection of the high frequency wave emitted from the circuit portion 14 when the thickness of the conductive layer 12 is ¼ to 4 times of the thickness in the case where the sheet resistance of the conductive layer 12 corresponds to the resistance component of the impedance of the substrate 10. It is preferable that the thickness of the conductive layer 12 is ⅓ to 2 times of the thickness in the case. And the thickness of the conductive layer 12 may be 3 nm to 200 nm, when the resistivity of the conductive layer 12 is $1.0\times10^{-6}$ Ωm to $2.5\times10^{-6}$ Ωm. It is possible to restrain the separation of the conductive layer 12, the increase of the manufacturing cost and the difficulty of controlling the thickness.

The conductive layer 12 is effective when the conductive layer 12 is provided on at least a part of the back face of the substrate 10. And it is possible to effectively restrain the reflection at the interface between the substrate 10 and the conductive layer 12 when the conductive layer 12 is provided on the whole area of the back face of the substrate 10. And it is possible to more effectively restrain the reflection at the interface between the substrate 10 and the conductive layer 12 when the conductive layer 12 is provided directly on the substrate 10.

The case, where the package 20 is composed of the package substrate 22 and the chassis 24, is mentioned above. The package 20 is effective when the substrate 10 can be mounted thereon. The package 20 may be a multilayer wiring substrate as a motherboard. The case, where the metal bump 16 is a face-down mounting portion. The effect of the present invention is obtained when a face-down mounting portion is provided.

While the above description constitutes the preferred embodiments of the present invention, it will be appreciated that the invention is susceptible of modification, variation and change without departing from the proper scope and fair meaning of the accompanying claims.

The present invention is based on Japanese Patent Application No. 2005-362649 filed on Dec. 16, 2005, the entire disclosure of which is hereby incorporated by reference.

What is claimed is:

1. An electronic device comprising:
   a substrate having a circuit portion used from 60 GHz to 80 GHz;
   a conductive layer provided directly on a face of the substrate that is opposite side of the circuit portion; and
   a substrate mounted portion where the face having the circuit portion of the substrate is mounted face down,
   wherein:
   the substrate is one of a GaAs substrate, a Si substrate, a SiC substrate, a sapphire substrate and a GaN substrate;
   the conductive layer is one of a NiCr layer of 4 nm to 70 nm thickness, a TaN layer of 10 nm to 200 nm thickness, an ITO layer of 10 nm to 160 nm thickness, in a case where the substrate is the GaAs substrate;
   the conductive layer is one of a NiCr layer of 3 nm to 65 nm thickness, a TaN layer of 10 nm to 180 nm thickness, an ITO layer of 5 nm to 140 nm thickness, in a case where the substrate is the Si substrate;
   the conductive layer is one of a NiCr layer of 3 nm to 63 nm thickness, a TaN layer of 7 nm to 160 nm thickness, an ITO layer of 5 nm to 140 nm thickness, in a case where the substrate is the SiC substrate;
   the conductive layer is one of a NiCr layer of 3 nm to 63 nm thickness, a TaN layer of 7 nm to 160 nm thickness, an ITO layer of 5 nm to 140 nm thickness, in a case where the substrate is the sapphire substrate; and
   the conductive layer is one of a NiCr layer of 3 nm to 68 nm thickness, a TaN layer of 10 nm to 180 nm thickness, an ITO layer of 5 nm to 140 nm thickness, in a case where the substrate is the GaN substrate.

2. The electronic device as claimed in claim 1, wherein the conductive layer has a resistivity of $1.0\times10^{-6}$ Ωm to $2.5\times10^{-6}$ Ωm.

3. The electronic device as claimed in claim 1, wherein the conductive layer is provided on a whole area of the face of the substrate that is opposite side of the circuit portion.

4. The electronic device as claimed in claim 1, wherein the conductive layer is electrically separated from the substrate mounted portion.

5. The electronic device as claimed in claim 1, wherein the conductive layer is exposed to a vacuum or a gas.

6. The semiconductor device as claimed in claim 1, wherein the conductive layer is electrically separated from the circuit portion.

7. A semiconductor device comprising:
   a substrate having a circuit portion used from 60 GHz to 80 GHz;
   a conductive layer provided directly on a face of the substrate that is opposite side of the circuit portion; and
   a face-down mounting portion for a face-down mounting that is provided on the face having the circuit portion of the substrate,
   wherein:
   the substrate is one of a GaAs substrate, a Si substrate, a SiC substrate, a sapphire substrate and a GaN substrate;
   the conductive layer-is one of a NiCr layer of 4 nm to 70 nm thickness, a TaN layer of 10 nm to 200 nm thickness, an ITO layer of 10 nm to 160 nm thickness, in a case where the substrate is the GaAs substrate;
   the conductive layer is one of a NiCr layer of 3 nm to 65 nm thickness, a TaN layer of 10 nm to 180 nm thickness, an ITO layer of 5 nm to 140 nm thickness, in a case where the substrate is the Si substrate;
   the conductive layer is one of a NiCr layer of 3 nm to 63 nm thickness, a TaN layer of 7 nm to 160 nm thickness, an ITO layer of 5 nm to 140 nm thickness, in a case where the substrate is the SiC substrate;
   the conductive layer is one of a NiCr layer of 3 nm to 63 nm thickness, a TaN layer of 7 nm to 160 nm thickness, an ITO layer of 5 nm to 140 nm thickness, in a case where the substrate is the sapphire substrate; and
   the conductive layer is one of a NiCr layer of 3 nm to 68 nm thickness, a TaN layer of 10 nm to 180 nm thickness, an ITO layer of 5 nm to 140 nm thickness, in a case where the substrate is the GaN substrate.

8. The semiconductor device as claimed in claim 7, wherein the conductive layer has a resistivity of $1.0\times10^{-6}$ Ωm to $2.5\times10^{-6}$ Ωm.

9. The semiconductor device as claimed in claim 7, wherein the conductive layer is provided on a whole area of the face of the substrate that is opposite side of the circuit portion.

10. The semiconductor device as claimed in claim 7, wherein the face-down mounting portion has a metal bump.

* * * * *